US008005230B2

(12) United States Patent
Farinelli, Jr. et al.

(10) Patent No.: US 8,005,230 B2
(45) Date of Patent: Aug. 23, 2011

(54) METHOD AND SYSTEM FOR DIGITALLY CONTROLLING A MULTI-CHANNEL AUDIO AMPLIFIER

(75) Inventors: Robert P. Farinelli, Jr., Lexington, KY (US); Jason Dunaway, Nashville, TN (US)

(73) Assignee: The AVC Group, LLC, Carlsbad, CA (US)

( * ) Notice: Subject to any disclaimer, the term of this patent is extended or adjusted under 35 U.S.C. 154(b) by 1283 days.

(21) Appl. No.: 10/746,151

(22) Filed: Dec. 22, 2003

(65) Prior Publication Data
US 2004/0176955 A1 Sep. 9, 2004

Related U.S. Application Data

(60) Provisional application No. 60/435,089, filed on Dec. 20, 2002.

(51) Int. Cl.
*H03G 11/00* (2006.01)
(52) U.S. Cl. .............................. 381/55; 700/94
(58) Field of Classification Search ........ 381/94.1–94.5, 381/120, 55, 106, 104; 704/255; 330/250, 330/278–279, 207 R, 129, 124 R, 207 P, 330/298; 700/94
See application file for complete search history.

(56) References Cited

U.S. PATENT DOCUMENTS

| 3,576,449 | A | | 4/1971 | Howell |
| 3,875,521 | A | | 4/1975 | Kikuchi et al. |
| 3,920,931 | A | | 11/1975 | Yanick, Jr. |
| 3,962,607 | A | | 6/1976 | Burns |
| 4,233,566 | A | | 11/1980 | Nestorovic et al. |
| 4,742,312 | A | | 5/1988 | Osburn et al. |
| 4,912,424 | A | | 3/1990 | Nicola et al. |
| 4,978,926 | A | * | 12/1990 | Zerod et al. .................. 330/279 |
| 5,001,440 | A | | 3/1991 | Zerod |
| 5,042,070 | A | * | 8/1991 | Linna et al. .................. 381/59 |
| 5,068,903 | A | * | 11/1991 | Walker ........................ 381/96 |
| 5,224,169 | A | | 6/1993 | Morris, Jr. et al. |
| 5,255,324 | A | * | 10/1993 | Brewer et al. ............... 381/107 |
| 5,295,178 | A | * | 3/1994 | Nickel et al. ................ 455/561 |
| 5,329,191 | A | | 7/1994 | Korhonen et al. |

(Continued)

FOREIGN PATENT DOCUMENTS

JP 07-231554 * 8/1995

OTHER PUBLICATIONS

Sonance Product Details: Sonamp 1250MKII. Datasheet [online]. Sonance, [retrieved on Jan. 20, 2004]. Retrieved from the Internet: <http://www.sonance.com/electronics/Sonamp Amplifiers/Sonamp_1250MKII>.

(Continued)

*Primary Examiner* — Xu Mei
*Assistant Examiner* — Lun-See Lao
(74) *Attorney, Agent, or Firm* — Crawford Maunu PLLC

(57) ABSTRACT

Audio signals are processed in a manner that facilitates control for overpower conditions. According to an example embodiment of the present invention, an audio processing circuit is configured and arranged for controlling an output audio signal as a function of an output power and/or clip condition. The audio processing circuit is adapted to approximate output power from an amplifier independent from output load and varying line conditions. When an overpower and/or clip condition is approximated, a signal is generated to reduce the output power by, e.g., reducing the signal gain and/or disconnecting the output.

21 Claims, 5 Drawing Sheets

U.S. PATENT DOCUMENTS

| | | | |
|---|---|---|---|
| 5,430,409 | A | 7/1995 | Buck et al. |
| 5,442,316 | A | 8/1995 | Buck et al. |
| 5,453,716 | A | 9/1995 | Person et al. |
| 5,483,692 | A | 1/1996 | Person et al. |
| 5,672,999 | A | 9/1997 | Ferrer et al. |
| 5,729,611 | A * | 3/1998 | Bonneville ............ 381/55 |
| 5,761,320 | A * | 6/1998 | Farinelli et al. ............ 381/81 |
| 5,815,584 | A * | 9/1998 | Whitecar et al. ............ 381/86 |
| 5,841,385 | A | 11/1998 | Xie |
| 5,940,518 | A * | 8/1999 | Augustyn et al. ............ 381/59 |
| 6,577,737 | B1 * | 6/2003 | Krochmal et al. ............ 381/55 |

OTHER PUBLICATIONS

CI 9060 Power Amplifier. Datasheet [online]. NAD electronics, 2003 [retrieved on Jan. 20, 2004]. Retrieved from the Internet: <http://www.nadelectronics.com/custom_installation/CI9060_framset.htm>.

PA 1235X 12 Channel Power Amplifier. Datasheet [online]. Xantech Corporation, 2001 [retrieved Jan. 20, 2004]. Retrieved from the Internet: <http://www.xantech.com/products/pa1235x.htm>.

Parasound: ZoneMaster Z-12 High Current Amplifier. Owner Manual [online]. Parasound Products Inc., 2000, rev 1.1, [retrieved on Jan. 20, 2004]. [Retrieved from the Internet: <http://www.parasound.com/service_information/owners_manuals/pdfs/zonemasterom.pdf>.

MA-361: Audioaccess Twelve Channel Digital Amplifier. Datasheet [online]. Madrigal Audio Laboratories, Inc., 2002 [retrieved on Jan. 20, 2004]. Retrieved from the Internet: <http://www.audioaccess.com/products/MA-361>.

Big Bang Power Amplifiers: BB 1265 Owners Manual. Owner Manual [online]. SpeakerCraft, 2000 [retrieved on Jan. 20, 2004]. Retrieved from the Internet: <http://www.speakercraft.com/products/downloads/manuals/big_bang_1265_amplifier>.

Russound: DPA-6.12. Datasheet [online]. Russound A/V Distribution and Control Systems, 2003 [retrieved on Jan. 20, 2004]. Retrieved from the Internet: <http://www.russound.com/products/amplifiers/DPA-6,12>.

Russound: DPA-6.12 Instruction Manual, Owner Manual [online]. Russound A/V Distribution and Control Systems, 2003 [retrieved on Jan. 20, 2004]. Retrieved from the Internet: <http://www.russound.com/products/amplifiers/DPA-6.12 >.

Installation and Operation Guide SI-1260. Owner Manual [online]. Niles Audio Corporation, 2000 [retrieved on Jan. 20, 2004].Retrieved from the Internet: <http://www.nilesaudio.com/pdffiles/manuals/si1260man.pdf>.

Crestron CNAMPZ-16X60 16 Channel Professional Audio Amplifier Operations Guide. Owner Manual [online]. Crestron Electronics, Inc., 2000 [retrieved on Jan. 20, 2004]. Retrieved from the Internet: <http://www.crestron.com/products/show_products.asp?jump=jump&type=residential&model=CNAMPX-16X60>.

* cited by examiner

METHOD AND SYSTEM FOR DIGITALLY CONTROLLING A MULTI-CHANNEL AUDIO AMPLIFIER

RELATED PATENT DOCUMENTS

This is a conversion of U.S. Provisional Patent Application Ser. No. 60/435,089, entitled "Multi-Channel Audio Amplifier," and filed on Dec. 20, 2002, to which priority is claimed under 35 U.S.C. §119.

FIELD OF THE INVENTION

The present invention relates in general to amplification control of an audio signal, and more particularly, to providing such control independent of an output load.

BACKGROUND OF THE INVENTION

Audio amplifiers are used in a variety of applications ranging from consumer audio systems to high-end professional applications including audio mixing and/or audio compressing. For many of these applications, the audio processing system amplifies an electrical audio signal received from an input source to move a speaker cone back and forth. In general, an audio processing system monitors an amplified electrical output signal to ensure proper operation of an amplifier and prevent clipping of the amplified electrical output signal. For example, the portion of the amplified electrical output signal larger in magnitude than the voltage supply of the audio processing system is clipped or eliminated. The clipping results in distortion of the amplified electrical output signal. Ideally, the audio processing system prevents the generation of distorted audio music that can destroy audio speakers and/or audio amplifiers as a result of the clipping.

Multi-channel audio processing systems are frequently used in residential homes, corporations, and schools in which audio music needs to be sent to one or more rooms. These audio processing systems may manipulate audio music derived from an input source (e.g., CD players, DSS receivers, DVD players, tuners, or tape decks). The various input sources generally require different amplification levels for numerous reasons. First, the input sources as compared to each other have different average and peak voltage levels due to gain mismatches in decoding, demodulating, and converter circuitry associated with the input sources. Second, the input sources as compared to each other have different average volume levels of recorded materials due to variations from artist to artist. Third, the sources as compared to each other have different average volume levels of recorded materials due to variations in the recording and mixing processes in the recording studio.

For example, the peak output voltage and dynamic range of digitally recorded content on CDs is very large as compared to that of a compressed AM or FM radio signal. These variations result in significant volume differences input into an amplifier from one source to the next. If the gain of an amplifier is set to amplify a low volume output signal with a minimal dynamic range, then the amplifier can clip a later source with a high volume output signal with a large dynamic range. The clipping results in audible distortion of the source and potential damage to the amplifier, speakers or both.

Previous attempts for preventing clipping have involved controlling the audio output signal of the audio processing system in relation to the audio input signal. One previous attempt presets the amplifier gain to a low level to prevent clipping regardless of the input source. However, the consumer experiences differences in audible levels between low volume input sources and high volume input sources. Low volume input sources may not receive sufficient amplification due to the small preset amplifier gain. A second previous attempt uses fast reacting gain limiting technology to prevent an output audio signal from clipping by quickly adjusting the amplifier gain. However, the fast reacting gain limiting technology creates distortion of the output audio signal and a reduction or compression of the dynamic range. A third previous attempt adjusts the volume manually to prevent clipping of the output audio signal. However, eliminating clipping may be difficult for multi-room audio systems if the adjustments are not located in the same room as the speakers. Also, the consumer may not recognize that clipping is occurring or want to be burdened with manually adjusting the volume for each song or source selected. Clipping can result in irreversible amplifier and/or speaker damage.

Audio processing systems can fail to operate due to improper installation or amplifier/speaker connections. For a residential multi-channel audio processing system, an amplifier connects to remotely located speakers via speaker wire running through residential walls. Common installer errors include mismatching speaker impedances with amplifier load ratings, complete or partial short-circuiting of amplifier outputs, amplifier overheating due to poor amplifier ventilation, and incorrectly set gain levels due to the remote location of the speakers. Diagnosing installation errors is complicated by the remote location of the speakers. Additionally, the remote and varied location of a speaker results in a variable speaker wire impedance further complicating amplifier/speaker matching. A typical audio processing system finds significant challenges in continuously monitoring and simultaneously correcting multiple sets of potential audio processing system failures, each one unique to the speaker configuration and wiring configuration.

The above and other difficulties in the implementation and operation of audio systems have presented challenges. In particular, damage to components of the audio system and/or improper audio signal delivery due to distortion or other conditions has continued to plague these and other related applications.

SUMMARY OF THE INVENTION

The present invention is directed to overcoming the above-mentioned challenges and others related to the types of approaches and implementations discussed above and in other applications. The present invention is exemplified in a number of implementations and applications, some of which are summarized below.

According to an example embodiment of the present invention, an audio processing system is adapted to monitor an output for overpower and/or clip conditions and, using an approximation of the output power that is independent of the output load on the system, controls the output power. The system includes a digital input gain circuit having at least one input gain block, with each input gain block generating an output signal in response to an audio input signal and a digital gain control signal. A power amplifier circuit is coupled to the output load and has at least one power amplifier, with each power amplifier being adapted to generate an audio output signal in response to an input signal. An overpower detection circuit is adapted for generating an overpower detection signal in response to each audio output signal. Each overpower detection signal is generated independent of varying output load and line conditions associated with the power amplifier circuit, as discussed above. A microprocessor and an input device coupled to the microprocessor are adapted for selecting an audio output signal and entering input gain levels for a selected audio output signal. In addition, the microprocessor is adapted for generating digital gain control signals in response to at least one overpower detection signal and input gain levels.

In another example embodiment, the microprocessor generates digital gain control signals as a function of the input gain levels when no overpower and/or clip condition exists. When an overpower and/or clip condition is detected, the microprocessor uses attack and release times to control any changes to the input gain levels. The attack time is a preset time for which the overpower and/or clip detection signals must be present before a change (reduction) in input gain signals is effected. The release time is a preset time for which the input gain signal reduction is held after the overpower and/or clip detection signals have ceased.

The above summary of the present invention is not intended to describe each illustrated embodiment or implementation of the present invention. The figures and the associated discussion that follows more particularly exemplify these embodiments.

BRIEF DESCRIPTION OF THE DRAWINGS

The invention may be more completely understood in consideration of the detailed description of various embodiments of the invention in connection with the accompanying drawings, in which.

Figure 1:
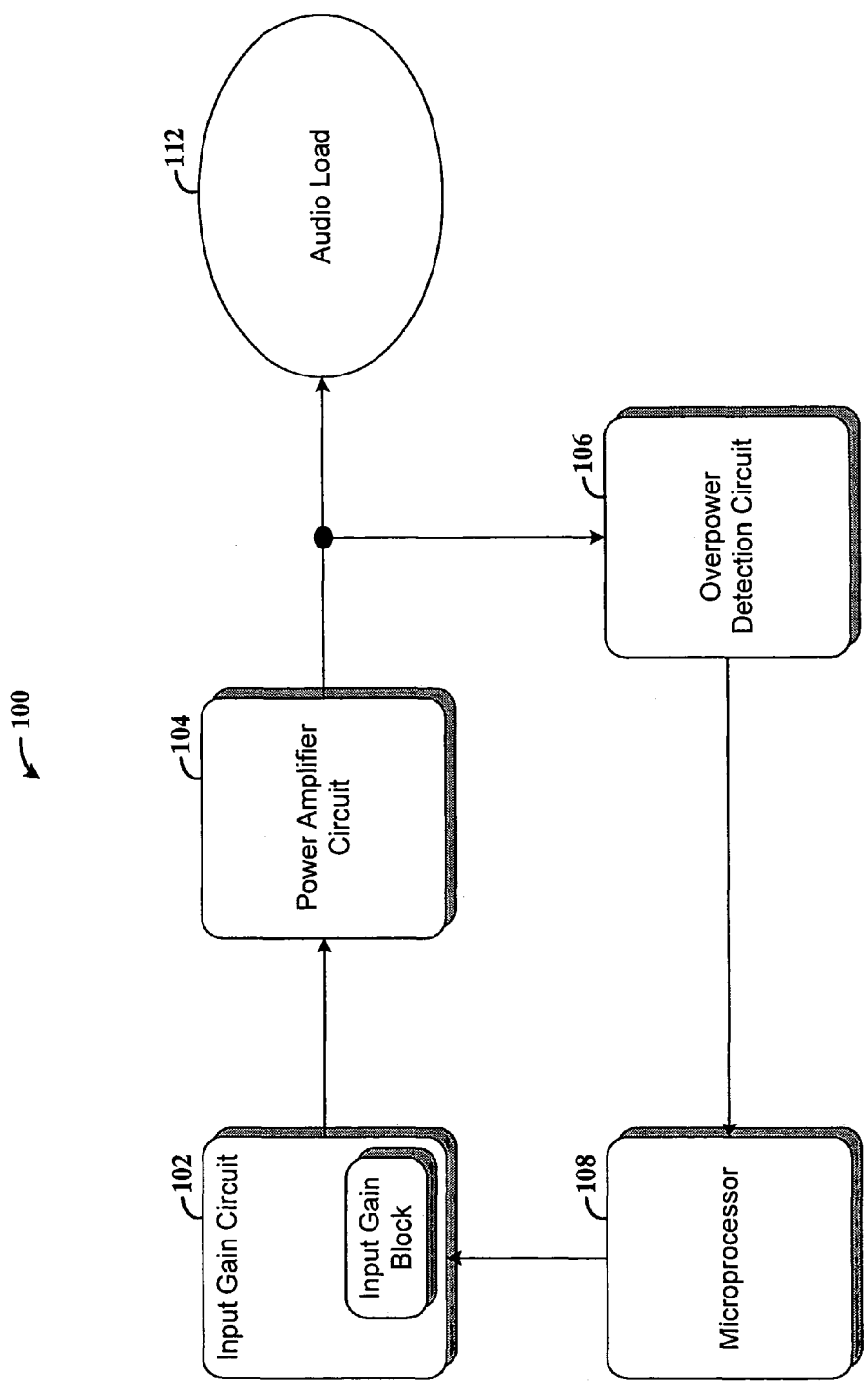
FIG. 1 illustrates a block diagram of an audio processing system with overpower protection in accordance with an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of audio processing systems and other such systems interfacing between one or more input sources having different and/or varied volume levels and multiple outputs to distributed loads. The present invention has been found to be particularly advantageous for audio processing applications in which undesirable level conditions can arise from remotely located distributed loads having a variable impedance and/or line length within a residence and/or business being coupled to an audio amplifier. The present invention is not necessarily limited to such applications; however, various aspects of the invention may be appreciated through a discussion of various examples using this context.

According to an example embodiment of the present invention, an audio processing system interfaces between several input sources (e.g., a CD player, a DSS receiver, and a radio tuner) and a remotely located distributed speaker load. At least one audio output signal is generated in response to an audio input signal received from an input source and the generated audio output signal(s) is sent to the remotely located distributed speaker load. The audio processing system monitors the audio output signal(s) for an overpower condition, and if the power level of an audio output signal exceeds a preset power limit, generates an overpower signal. The preset power limit may, for example, be fixed during the manufacture of the audio processing system and/or be set by an end user with a fixed or adjustable power limiting arrangement. The overpower signal is generated independently from the remotely located distributed speaker load, which may vary from audio zone to audio zone within a facility. When an overpower signal is generated, the audio processing system digitally reduces the amplifier gain so that the power level of the audio output signal does not exceed the preset power level. With this approach, an overpower signal is consistently generated for speakers having different impedance as well as with loads having varied impedance (e.g., due to variations in the length of signal-carrying medium for different listening zones).

In one implementation, circuits exhibiting relatively slow reacting gain reduction time constants are implemented across the entire frequency range of the audio input signal. This slow reaction approach is useful, for example, to mitigate or even prevent distortion in the audio output signal. The audio processing system is implemented to regularly monitor the overpower condition of the audio output signal in comparison to the adjustable preset power limit, which prevents long term abuse caused by improper amplifier gain settings and improper speaker loads being attached to the audio processing system.

Turning now to the figures, FIG. 1 shows an audio processing system 100 having overpower protection, according to another example embodiment of the present invention. The audio processing system 100 generates one or more audio channels (output signals) for distribution throughout one or more audio zones within a facility as exemplified, for example, in U.S. Pat. No. 5,131,048 (Farinelli et al.), which is fully incorporated herein by reference. In accordance with alternative example embodiments, the system of this '048 patent is modified by the aspects described herein in connection with FIG. 1 and load-isolation and control aspects described in concurrently-filed U.S. patent application Ser. No. 10/746,150 (U.S. Pat. No. 7,664,273) entitled "Approach for Controlling Audio Signals in Remote Location" and fully incorporated herein by reference.

The audio processing system 100 includes a digital input gain circuit 102, a power amplifier circuit 104, an overpower detection circuit 106, a microprocessor 108, and a keypad 110. At least one audio output signal is generated in response to an audio input signal received from a user-selected input source (e.g., selection of one or more of CD players, DSS receivers, DVD players, tuners, or tape decks). For example, a user can couple a CD player with all audio channels throughout a residence by making a selection at a user interface such as a switch box, keyboard, touch pad or touch screen. Alternatively, a user can couple two or more input sources with different output channels (e.g., by coupling a CD player with a first audio channel and a tuner with a second audio channel). The audio processing system 100 sends the audio output signal(s) from the selected input source(s) to an output destination such as a speaker load, an audio distribution station or a manipulating server station for residential/business applications.

The audio processing system 100 receives an audio input signal via the digital input gain circuit 102, which includes at least one input gain block for amplifying each audio channel of the audio processing system. The amount of amplification (gain) varies as a function of digital gain control signals received by the digital input gain circuit 102 from the microprocessor 108. Each input gain block of the digital input gain circuit 102 can be set to a different gain if so desired. One or more fixed input gain signal(s) is(are) sent from the digital input gain circuit 102 to a power amplifier circuit 104 having at least one power amplifier. Each power amplifier within the power amplifier circuit 104 amplifies the input gain signal and generates an audio output signal for a particular audio channel load 112 including a speaker load and other connectivity impedance (i.e., speaker wire).

The overpower detection circuit 106 is coupled to the particular audio channel(s) via which the audio output signal is sent and generates an overpower detection signal as a function of the audio output signal and an adjustable preset power limit indicator. The overpower detection circuit 106 determines an indicator for the output power of each audio output signal and compares the output power indicator with the adjustable preset power limit. If the output power of an audio output signal exceeds the adjustable preset power limit indicator, the overpower detection circuit 106 generates an activated overpower detection signal (e.g., a logic "one" indicating that the audio output signal exceeds a desired power level). If the output power of an audio output signal is less than or equal to the adjustable preset power limit, then the overpower detection circuit 106 generates an inactivated overpower detection signal (e.g., a logic "zero").

The overpower detection signal is sent to the microprocessor 108, which generates digital gain control signals in response to the overpower detection signal. In one implementation, the microprocessor 108 also processes input gain values entered via a keypad 110 in connection with the overpower detection signal(s) for use in setting, e.g., the gain of the input gain circuit 102 accordingly. The digital gain control signals are selected to either increase or decrease the gain of digital input gain circuit 102 as a function of the overpower detection signal(s) and/or user input gain values. The microprocessor 108 also controls the gain time constant of the gain control signals sent to the input gain circuit 102 to control the speed at which gain adjustments occur. In one implementation, slow reacting gain time constants that gradually increase or decrease the gain across the entire frequency range of the audio input signal are used to mitigate or eliminate distortion of the audio input signal.

In another particular implementation, the audio processing system 100 is used as follows. The microprocessor 108 generates a first gain control signal in response to a user input gain value (e.g., input volume level for listening to music) and sends the first gain control signal to the digital input gain circuit 102. The first gain control signal sets the gain of the digital input gain circuit 102 to a first gain factor over a first time period determined by the microprocessor 108. The digital input gain circuit 102 generates an input gain signal from an audio input signal (e.g., from a CD player) in accordance with the gain set using the first gain control signal. The power amplifier circuit 104 receives and amplifies the input gain signal, with the amplified signal being output to an audio load 112 (e.g., an audio speaker system).

If the audio output signal exceeds a preset power limit, the overpower detection circuit 106 generates a logic "one" overpower detection signal and sends the signal to the microprocessor 108, which generates a second gain control signal in response thereto. The second gain control signal is sent to the digital input gain circuit 102, which uses the second gain control signal to reduce the gain by a second gain factor over a second time period determined by the microprocessor 108. When the audio output signal returns to a level that does not exceed the preset power limit, the overpower detection circuit ceases to send the overpower detection signal (i.e., sends a logic "zero" overpower detection signal) to the microprocessor 108. The microprocessor 108 sends the third gain control signal to the digital input gain circuit 102, which uses the third gain control signal to set the gain of the digital input gain circuit 102 to a third gain factor over a third time period determined by the microprocessor 108. Monitoring the audio output signal using this approach mitigates long term abuse typically caused by improper digital input gain circuit settings and/or improper speaker loads that often vary in impedance due to the impedance of the particular speakers being used and the signal lines coupled thereto.

In another implementation, the digital input gain circuit 102 is a digital potentiometer having preset variable gain settings. A variable resistance setting is used as a basis for which the preset variable gain settings are made. For instance, where an 8 ohm resistance setting is made, the preset variable gain setting is set accordingly. This 8 ohm resistance setting may, for example, be set by a user via the keypad 212.

In another implementation, the microprocessor 108 generates two gain control signals (A and B) in response to user input gain values for use, e.g., with different listening areas. For instance, users may wish to set a first input volume level for listening to audio in a first listening location and a second input volume level for listening to audio in a second listening location. In some instances, the audio source for each of the first and second listening locations is also different (e.g., with a CD audio source being used in a first room and a radio tuner source being used in a second room). In this regard, the microprocessor 108 sends different ("A" and "B") gain control signals to the digital input gain circuit 102 for each listening location, with the digital input gain circuit having an input block for each listening location. The "A" gain control signal sets the gain of the first input block to a first gain factor over a first time period determined by the microprocessor 108. The "B" gain control signal sets the gain of the second input block to a second gain factor over a second time period determined by the microprocessor 108. The power amplifier circuit 104 uses first and second power amplifiers to respectively generate first and second audio output signals in response to the first and second input gain signals. The overpower detection circuit 106 monitors the audio output signals for each listening location and accordingly generates an output (or lack thereof) representing logic "one" (for overpower) or "zero" (no overpower) that is accordingly used to control the gain for each listening location.

In connection with the preceding paragraph, a safe power output level for the first output signal (first listening location) may be different than a safe power level for the second output signal (second listening location) depending on the load of the first output signal compared to the second output signal. The adjustable preset power limit of the overpower detection circuit 106 is set to a conservatively low value to protect the audio processing system from adverse conditions under a variety of speaker loads (e.g., 4, 6 and 8 ohm resistances). The regular power monitoring of the overpower detection circuit 106 prevents long term abuse caused by improper digital input gain circuit 102 settings and improper speaker loads being attached to the audio processing system 100.

The audio processing system 100 is adapted to couple with a variety of output destinations (e.g., a speaker load, an audio distribution station, and a manipulating server station). For instance, the audio processing system 100 can couple with a speaker load distributed throughout a residence or business. The overpower detection circuit 106 generates overpower detection signals regardless of the speaker load which may vary from room to room within a residence or business. The audio processing system 100 can also couple with an audio distribution station, such as a paging system in a school or hospital. In this case, the audio processing system 100 can send one or more audio channels to either an entire school or alternatively, particular locations within a school via the audio distribution station. The audio processing system 100 can also couple with a manipulating server station, such as a residential server station that manipulates audio and video signals to/from multiple locations on a residential property. These and many other applications are readily implemented using the above-discussed approaches.

Figure 2:
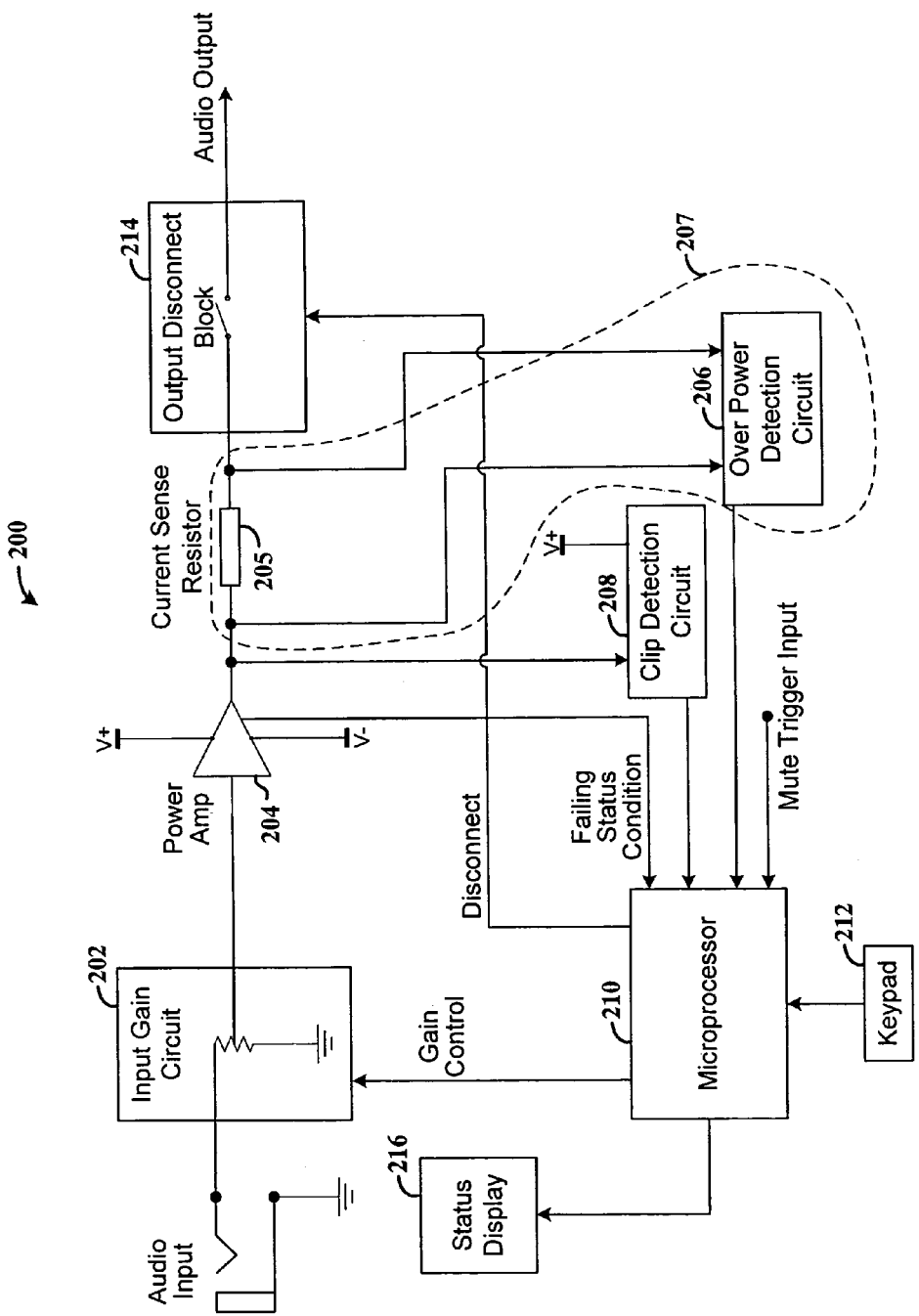
FIG. 2 shows an audio processing system with overpower and clip protection in accordance with another example embodiment of the present invention.

FIG. 2 illustrates a block diagram of an audio processing system 200 with overpower and clip protection in accordance with various example embodiments of the present invention. The audio processing system 200 can generate at least one audio channel signal (output signal) for distribution throughout a residence or business. The audio processing system 200 includes a digital input gain circuit 202, a power amplifier circuit 204, an overpower detection circuit 206 coupled across a current sense resistor 205, a clip detection circuit 208, a microprocessor 210, a keypad 212, an output disconnect block 214, and a status display 216. The digital input gain circuit 202, power amplifier circuit 204, overpower detection circuit 206, microprocessor 210, and keypad 212 may be functionally implemented in a manner similar to the digital input gain circuit 102, power amplifier circuit 104, overpower detection circuit 106, microprocessor 108 and keypad 110 shown in FIG. 1.

The audio processing system 200 receives an audio input signal via a digital input gain circuit 202, which includes at least one input gain block for amplifying each audio channel of the audio processing system 200. The digital input gain circuit 202 amplifies the audio input signal to generate input gain signal(s). The amount of amplification (gain) varies as a function of digital gain control signals received by the digital input gain circuit 202 from a microprocessor 210. The digital input gain circuit 202 sends the input gain signal(s) to a power amplifier circuit 204 with a fixed gain. The power amplifier circuit 204 includes one or more power amplifiers, depending upon the needs of the particular application to which it is applied. Each power amplifier within the power amplifier circuit 204 amplifies an input gain signal generated from an input gain block of the digital input gain circuit 202 and generates an audio output signal. The output from the power amplifier circuit 204 is coupled to an overpower detection circuit 206, a clip detection circuit 208 and an audio output coupled, e.g., to a speaker load.

The overpower detection circuit 206 generates an overpower detection signal as a function of each audio output signal and an adjustable preset power limit. More particularly, the overpower detection circuit 206 detects the output power of each audio output signal for comparison with the adjustable preset power limit. If the output power of an audio output signal exceeds the adjustable preset power limit, the overpower detection circuit 206 generates an activated (logic "one") overpower detection signal, indicating that an audio output signal exceeds a safe power level. If the output power of an audio output signal is less than or equal to the adjustable power limit, then the overpower detection circuit 206 generates an inactivated (logic "zero") overpower detection signal.

The overpower detection circuit 206 generates the overpower detection signal(s) independent from a potentially varying output load. For example, a speaker output load may vary from room to room within a residence and not affect the generation of the overpower detection signal(s). The user doesn't have to monitor each channel and reduce the input gain for an audio output signal with a dangerously high power associated with its speaker load. The overpower detection circuit 206 sends the overpower detection signal(s) to a microprocessor 210.

The clip detection circuit 208 generates a clip detection signal in response to the audio output signal(s) and a positive voltage level derived from a maximum positive voltage supply of the audio processing system 200. The clip detection circuit 208 compares the output voltage of each audio output signal with the positive voltage level (reference voltage level). If the output voltage of an audio output signal exceeds the reference voltage level, the clip detection circuit 208 generates a logic "one" clip detection signal. If the output power of an audio output signal is less than or equal to the reference voltage level, the clip detection circuit 208 generates a logic "zero" clip detection signal. A logic "one" clip detection signal indicates that clipping occurs as an audio output signal exceeds the maximum positive voltage supply, which fluctuates as a function of varying output load and line conditions (e.g., speaker load and speaker wire conditions). Accordingly, the clip detection signal(s) fluctuate as a function of varying load and line conditions, thus automatically providing detection signals to a microprocessor 210.

The microprocessor 210 generates digital gain control signals in response to the overpower detection signal(s), clip detection signal(s) and/or user input gain values entered via a keypad 212. The microprocessor 210 sends the gain control signals to the digital input gain circuit 202. The gain control signals set (e.g., either increase or decrease) the digital input gain circuit 202 as a function of the overpower detection signal(s), clip detection signal(s), and/or user input gain values. The microprocessor 210 controls the gain time constants of the gain control signals, with the gain time constants being used to determine how quickly the gain adjustments occur. Slow reacting gain time constants gradually increase or decrease the gain across the entire frequency range of the audio input signal. Accordingly, the slow reacting gain time constants in combination with the digital input gain circuit 202 do not distort the audio input signal.

The microprocessor 210 monitors the status of each amplifier within the power amplifier circuit 204. Failing status conditions include amplifier power failure, overheating, short circuit, and improper power supply voltage. If the microprocessor 210 detects any of the failing status conditions, then the microprocessor 210 sends output disconnect signal(s) to an output disconnect block 214. The output disconnect block 214 includes a disconnect relay switch for each power amplifier in the power amplifier circuit 204. The output disconnect block 214 disconnects an output load from a failing power amplifier until the failing status condition terminates. At the same time as the disconnected output load occurs, the microprocessor 210 sends the failing status condition(s) to a status display 216. A user can view the status display, which displays a letter "F" if any failing status conditions occur.

In one implementation, the system 200 cycles through operating conditions beginning with normal conditions, followed by an overpower and/or clip condition and then returning to a normal condition as follows. The microprocessor 210 generates a first gain control signal in response to a user input gain value (e.g., input volume level for listening to a CD) and sends the first gain control signal to a digital input gain circuit 202. The first gain control signal initially sets the gain of the digital input gain circuit 202 by a first gain factor over a first time period determined by the microprocessor 210. The first gain control signal initially sets the gain of the digital input gain circuit 202, which generates an input gain signal, and the power amplifier circuit 204 generates an audio output signal in response to the input gain signal. When the audio output signal exceeds a positive reference voltage, the clip detection circuit 208 generates a logic "one" clip detection signal. The microprocessor 210 generates a second gain control signal in response to a logic "one" clip detection signal and sends the second gain control signal to the digital input gain circuit 202. The second gain control signal reduces the gain of the digital input gain circuit 202 by a second gain factor over a second time period determined by the microprocessor 210. Specifically, the microprocessor 210 reduces the gain of the digital input gain circuit 202 to reduce the voltage level of the audio output signal to a non-clipped level to prevent distortion of the input audio signal. When a logic "zero" clip detection signal is subsequently detected (indicating no presence of a clip condition), the microprocessor 210 generates a third gain control signal that is similar to the first gain control signal and sends the third gain control signal to the digital input gain circuit 202. For instance, the third gain control signal may be set close to, but slightly less than the first input gain signal to guard against additional clip conditions.

The audio processing system 200 is adapted to couple with a variety of output destinations (e.g., a speaker load, an audio distribution station, and a manipulating server station). For example, the audio processing system 200 can couple with a speaker load distributed throughout a residence or business. The overpower detection circuit 206 generates overpower detection signals regardless of the speaker load which may vary from room to room within a residence or business. The audio processing system 200 can also couple with an audio distribution station, such as a paging system in a school or hospital. In this case, the audio processing system 200 can send multiple audio channels to either an entire school or alternatively, particular locations within a school via the audio distribution station. The audio processing system 200 can further couple with a manipulating server station, such as a residential server station that manipulates audio and video signals to/from multiple locations on a residential property.

Figure 3:
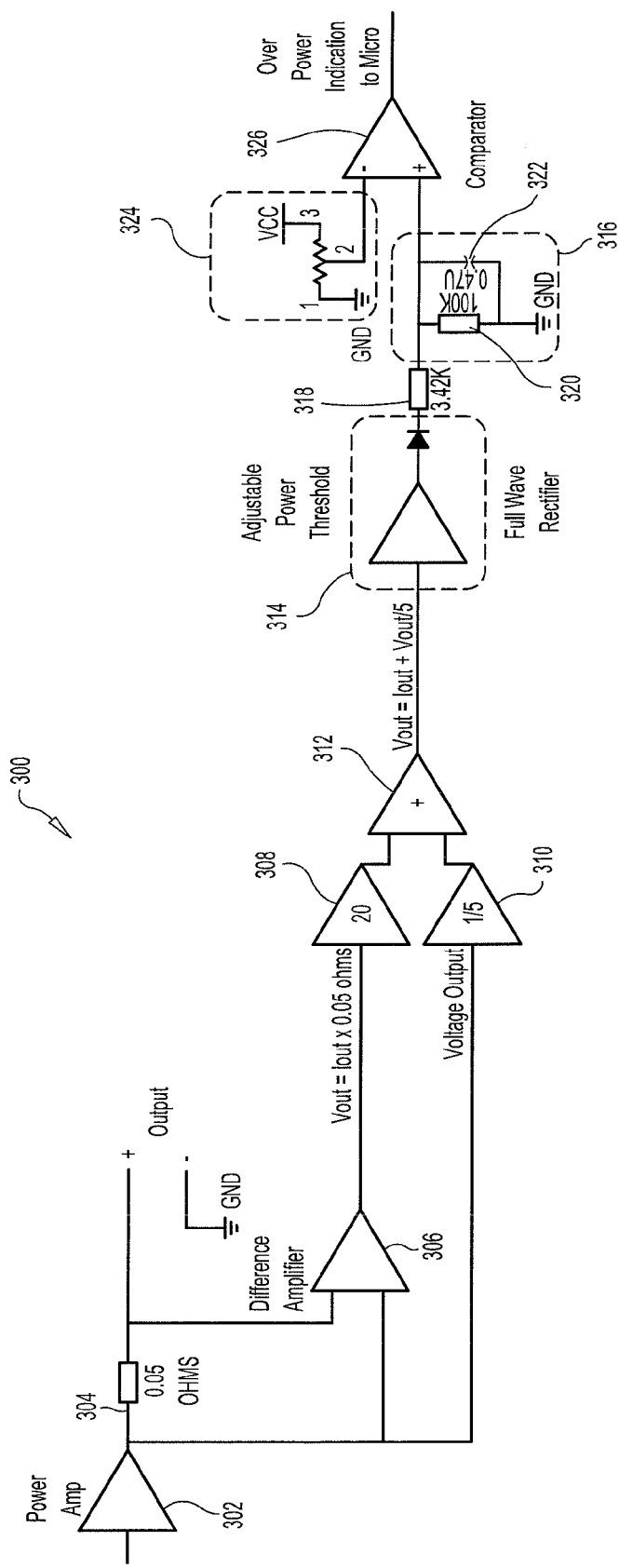
FIG. 3 shows an overpower detection circuit in accordance with another example embodiment of the present invention.

FIG. 3 illustrates an overpower detection circuit in accordance with various embodiments of the present invention. The overpower detection circuit 300 may, for example, be functionally implemented as an overpower detection circuit with the examples shown and described in connection with FIG. 1 (circuit 106) and FIG. 2 (circuit 207 including overpower detection circuit 206 and current sense resistor 205). The overpower detection circuit 300 includes various types of operational amplifiers (e.g., power amplifiers with a fixed gain, difference amplifiers, summation amplifiers, and comparator amplifiers), resistors, a capacitor, a supply voltage, and a full wave rectifier. The overpower detection circuit 300 monitors the output of each power amplifier within a power amplifier circuit similar to a power amplifier circuit 104 in FIG. 1 and compares the amplifier output with a preset power limit, which is fixed independent of an amplifier load. The gain of an input gain circuit similar to an input gain circuit 102 in FIG. 1 is reduced if the amplifier output power exceeds the preset power limit. The overpower detection circuit 300 prevents long term excessive power conditions, which can damage amplifiers and output loads.

The overpower detection circuit 300 monitors the output (e.g., current and voltage) of each power amplifier 302 and compares the output power to a preset power limit. The output power is calculated as a function of the output voltage and current according to a relationship represented, e.g., by the following equation:

$$\text{Power} = \text{Voltage}(V) * \text{Current}(I) \quad (1)$$

The output power is integrated and compared with the preset power limit to determine if an overpower condition occurs.

The overpower detection circuit 300 monitors the output signal of a power amplifier 302 with a current sense resistor 304. A difference amplifier 306, with gain (ratio of output over input) equal to "one," is coupled to the output signal before and after the current sense resistor 304. The difference amplifier 306 draws a relatively small current from the output signal and generates a voltage signal equal to the voltage drop across the current sense resistor 304, which can be calculated according to Ohm's law, i.e., $$\text{Voltage}(V) = \text{Current}(I) * \text{Resistance}(R) \quad (2)$$

Therefore, the voltage drop across the current sense resistor 304 equals the output current ($I_{out}$) multiplied by the resistance of the current sense resistor. For a current sense resistor ($R_{cs}$) equal to 0.05 ohms, the voltage drop $V_{cs}$ across $R_{cs}$ can be approximated with the following equation $$V_{cs} = 0.05 * I_{out} = V_{diff} \quad (3)$$

where $V_{diff}$ is the voltage signal generated by the difference amplifier 306. An amplifier 308, with a fixed gain equal to twenty, generates an output signal ($V_{20}$) in which $$V_{20} = 20 * 0.05 * I_{out} = I_{out} \quad (4)$$

An amplifier 310, with a fixed gain equal to ⅕, generates an output signal ($V_{1/5}$) in which $$V_{1/5} = (1/5) * V_{out} \quad (5)$$

An amplifier 312, which sums its input signals, generates an output signal ($V_{sum}$) in which $$V_{sum} = V_{1/5} + V_{20} = (1/5) * V_{out} + I_{out} \quad (6)$$

where $V_{sum}$ represents the summation of the output current of the power amplifier 302 and a scaled amplifier output voltage which vary as a function of time. $V_{sum}$ can have both positive and negative cycles as it has been derived from the output signal of the power amplifier 302 that has positive and negative cycles.

A full wave rectifier 314 generates a positive output signal in response to the $V_{sum}$ output signal. The full wave rectifier 314 replicates the positive cycles of the $V_{sum}$ output signal and sets the negative cycles of the $V_{sum}$ output signal to logic "zero". A resistor capacitor (RC) circuit 316 integrates the positive output signal for comparison with a preset power limit. The RC circuit 316 includes a resistor 318, a resistor 320, and a capacitor 322. The RC product of resistor 318 and capacitor 322 determines the attack or charge time of the RC circuit 316. The attack time filters any short lived power spikes, which do not cause clipping damage due to their short time period. An overpower condition must occur for a certain time period (attack time) before a microprocessor reduces the gain of the input gain circuit 102 in FIG. 1, for example. The RC product of resistor 320 and capacitor 322 determines the release or discharge time of the RC circuit 316. An overpower condition must not occur for a certain time period (release time) before a microprocessor increases the gain of the input gain circuit 102 in FIG. 1. A similar approach for attack and release times is discussed below in connection with FIG. 5.

A comparator amplifier 326 compares the output power to an adjustable preset power limit 324. The comparator amplifier generates a logic "one" overpower signal if the output power of the power amplifier 302 exceeds the preset power limit 324. The comparator amplifier generates a logic "zero" overpower signal if the output power of the power amplifier 302 is less than or equal to the preset power limit 324. The overpower detection circuit 300 sends an overpower signal to a microprocessor (not shown), which can then adjust the gain of the input gain circuit (not shown) in response to the overpower signal and a met attack/release time. The overpower detection circuit 300 generates an overpower signal independent of a potentially variable output load. The overpower detection circuit prevents long term power abuse caused by improper gain setting of an input gain circuit and improper variable output loads.

With the approach shown in and discussed above in connection with FIG. 3, the output from the power amplifier 302 can be controlled via an approximation involving the following resistance loads while maintaining total power of about 50 W. For an 8 ohm load, corresponding voltage and current are at about 20V and 2.5 A; for a 6 ohm load, corresponding voltage and current are at about 17.3V and 2.88 A; and for a 4 ohm load, corresponding voltage and current levels are at about 14.14V and 3.53 A. In this regard, the approximation indicated by the above equation 6 can be implemented for these different loads.

In another example embodiment of the present invention, the power amplifier 302 generates an output signal in response to an input gain signal generated from an input gain circuit. The difference amplifier 306 generates a voltage signal ($V_{diff}$) indicating the voltage drop across the current sense resistor 304. The amplifier 308 amplifies the $V_{diff}$ signal by a fixed gain of twenty. A $V_{20}$ signal equals $I_{out}$ for a 0.05 ohm current sense resistor 304. The amplifier 310 amplifies the $V_{out}$ signal by a fixed gain of ⅕, where a $V_{1/5}$ signal equals ⅕*$V_{out}$. Summation amplifier 312 sums the $V_{20}$ and $V_{1/5}$ signals. A full wave rectifier 314 replicates the positive cycles of the $V_{sum}$ signal. An RC circuit 316 integrates the $V_{sum}$ signal to generate an output power signal for comparison with a preset power limit 324. An example RC circuit 316 includes a 3.42 kilo ohm resistor 318, a 100 kilo ohm resistor 320, and a 0.47 micro farad capacitor 322.

attack time=resistor 318*capacitor 322=3.42 kilo ohm*0.47 micro farad=1.5 milliseconds (mS)  (7)

release time=resistor 320*capacitor 322=100 kilo ohm*0.47 micro farad=47 milliseconds (mS)  (8)

A comparator amplifier 326 compares the output power signal to the preset power limit to generate an overpower signal. The comparator amplifier generates a logic "one" overpower signal if the output power of the power amplifier 302 exceeds the preset power limit 324. The comparator amplifier generates a logic "zero" overpower signal if the output power of the power amplifier 302 is less than or equal to the preset power limit 324. The overpower detection circuit 300 sends an overpower signal to a microprocessor similar to a microprocessor 108 in FIG. 1. The microprocessor reduces the input gain of an input gain circuit in response to a logic "one" overpower signal that has met the attack time of 1.5 mS. A logic "one" overpower signal occurring for less than 1.5 mS is ignored by the microprocessor. A short lived voltage/current output signal spike can create the short lived overpower signal. The microprocessor waits for the logic "one" overpower signal to occur for longer than the attack time to ensure that the input gain really needs to be reduced. Altering the resistor 318 and capacitor 322 values changes the attack time.

The microprocessor increases the input gain of an input gain circuit in response to a logic "zero" overpower signal that has met the release time of 47 mS. A logic "zero" overpower signal occurring for less than 47 mS is ignored by the microprocessor. The microprocessor waits for the logic "zero" overpower signal to occur for longer than the release time to ensure that the input gain can safely increase. Altering the resistor 320 and capacitor 322 values changes the release time.

Figure 4:
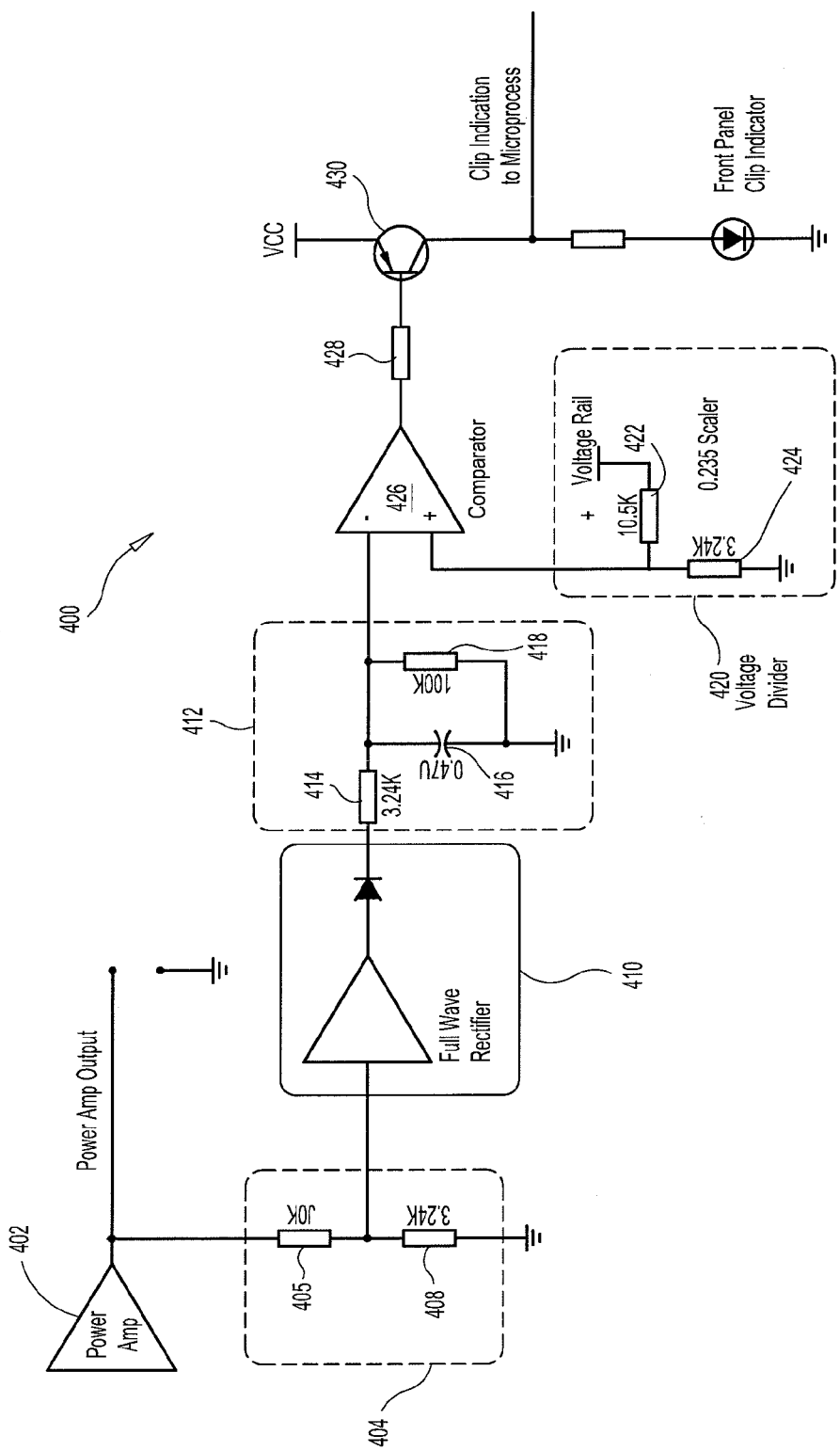
FIG. 4 illustrates a clip detection circuit in accordance with another example embodiment of the present invention.

FIG. 4 illustrates a clip detection circuit in accordance with various embodiments of the present invention. The clip detection circuit 400 may, for example, be implemented with the clip detection circuit 208 shown and described in connection with FIG. 2. The clip detection circuit 400 includes various types of operational amplifiers (e.g., power amplifiers and comparator amplifiers), resistors, a capacitor, a supply voltage, a transistor, and a full wave rectifier. The clip detection circuit 400 monitors the output of each power amplifier within a power amplifier circuit similar, e.g., to power amplifier circuit 104 in FIG. 1, and compares the amplifier output with a scaled positive voltage, which fluctuates with varying output load and line conditions. The gain of an input gain circuit similar, e.g., to that shown and discussed in connection with the input gain circuit 102 in FIG. 1 is reduced if the amplifier output voltage exceeds the scaled positive voltage. A user can enable or disable the clip detection circuit 400.

The clip detection circuit 400 prevents clipping conditions, which can damage amplifiers and output loads, in a manner that does not affect the sonic characteristics of audio input signals. The clip detection circuit 400 monitors the entire audio spectrum, thus maintaining the instantaneous relationship between all frequencies being amplified. The scaled positive supply voltage being dependent on the varying output load and line conditions automatically provides an appropriate amount of clipping protection. Excessive clipping protection reduces the gain of an audio signal more than is safely needed, while minimal clipping protection can result in damage to amplifiers and output loads.

Most audio system users are not able to determine that clipping conditions are occurring, especially for remotely located output loads. For example, a distributed speaker load can vary from room to room within a residence. A user may have difficulty in determining that a first speaker load in a first room combined with a first user input gain creates a clipping condition causing amplifier/speaker damage, while a second speaker load in a second room combined with a second user input gain does not create a clipping condition.

The clip detection circuit 400 compares a scaled output signal of a power amplifier 402 with a scaled positive supply voltage to determine if a clip condition occurs. The output signal and positive supply voltage are scaled by similar factors to maintain the correct ratio between these signals. A power amplifier 402 sends the output signal to an output load and a voltage divider 404. The voltage divider 404 includes a resister 406 and a resistor 408, with the voltage of the voltage divider 404 dropping as follows:

Voltage(resistor 408)=[resistor 408/(resistor 406+resistor 408)]*$V_{out}$  (9)

The voltage of resistor 408 is derived from the output signal according to the ratio of resistor values to create a scaled voltage signal as the input of a full wave rectifier 410. The voltage signal across resistor 408 can have both positive and negative cycles as it has been derived from the output signal of the power amplifier 402 that has positive and negative cycles. {insert voltage v time waveform}

A full wave rectifier 410 generates a positive output signal in response to the scaled voltage signal. The full wave rectifier 410 replicates the positive cycles of the scaled voltage signal and sets the negative cycles of the scaled voltage signal to logic "zero". A resistor capacitor (RC) circuit 412 integrates the positive output signal for comparison with a scaled positive supply voltage. The RC circuit 412 includes a resistor 414, a capacitor 416, and a resistor 418. The RC product of resistor 414 and capacitor 416 determines the attack or charge time of the RC circuit 412. The attack time filters any short lived voltage spikes, which do not cause clipping damage due to their short time period. A clipping condition must occur for a certain time period (attack time) before a microprocessor reduces the gain of the input circuit gain. The RC product of resistor 418 and capacitor 416 determines the release or discharge time of the RC circuit 412. A clipping condition must not occur for a certain time period (release time) before a microprocessor increases the gain of the input circuit gain.

A comparator amplifier 426 compares the positive output signal received from the RC circuit 412 to a scaled supply signal derived from a positive voltage supply. A voltage divider 420 determines the scaled voltage signal. The voltage divider 420 includes a resistor 422 and a resistor 424. The scaled voltage can found by the following equation:

$$\text{scaled voltage} = \text{positive supply voltage} * [\text{resistor 424}/(\text{resistor 422} + \text{resistor 424})] \quad (10)$$

The comparator amplifier 426 generates a logic "one" comparator signal if the scaled supply signal exceeds the positive output signal received from the RC circuit 412. The comparator amplifier 426 generates a logic "zero" comparator signal if the scaled supply signal is less than the positive output signal received from the RC circuit 412. The comparator amplifier 426 sends the comparator signal through an input base resistor 428 to the base input of a transistor 430. A logic "one" comparator signal causes a non-conducting state for the transistor resulting in a logic "zero" clip signal being sent to a microprocessor. A logic "zero" comparator signal causes a conducting state for the transistor resulting in a logic "one" clip signal being sent to a microprocessor. In one implementation, when Vcc coupled to the transistor 430 is set to about 5V, the comparator signal swings between +12V (off) and 0V (on). The clip detection circuit 400 sends a clip signal adapted for use by a microprocessor, which can then adjust the gain of an input gain circuit for the application in response to the clip signal and a met attack/release time. The clip detection circuit 400 generates a logic "one" clip signal if the scaled supply signal is less than the positive output signal received from the RC circuit 412. The clip detection circuit 400 generates a logic "zero" clip signal if the scaled supply signal is less than the positive output signal received from the RC circuit 412.

In another example embodiment of the present invention, the power amplifier 402 generates an output signal in response to an input gain signal generated from an input gain circuit. The voltage divider 404 derives a scaled voltage signal in response to the output signal as a function of the resistor values for resistor 406 and resistor 408. An example voltage divider 404 includes 10 kilo ohm resistor 406 and a 3.24 kilo ohm resistor 408. The scaled voltage signal can be found by the following equation:

$$\text{scaled voltage signal} = \text{output signal} * [\text{resistor 408}/(\text{resistor 406} + \text{resistor 408})] \quad (11)$$

The scalar factor equals 0.244 for these particular resistor values. A full wave rectifier 410 replicates the positive cycles of the scaled voltage signal and sets the negative cycles to logic "zero". A resistor capacitor (RC) circuit 412 integrates the positive output signal of the full wave rectifier 410 for comparison with a scaled positive supply voltage. An example RC circuit 412 includes a 3.24 kilo ohm resistor 414, a 100 kilo ohm resistor 418, and a 0.47 micro farad capacitor 416. The RC circuit 412 attack and release times can be calculated as follows:

$$\text{attack time} = \text{resistor 318} * \text{capacitor 322} = 3.42 \text{ kilo ohm} * 0.47 \text{ micro farad} = 1.5 \text{ milliseconds (mS)} \quad (12)$$

$$\text{release time} = \text{resistor 320} * \text{capacitor 322} = 100 \text{ kilo ohm} * 0.47 \text{ micro farad} = 47 \text{ milliseconds (mS)} \quad (13)$$

The attack time filters any short lived voltage spikes, which do not cause clipping damage due to their short time period. A clipping condition must occur for a certain time period (attack time) before a microprocessor reduces the gain of the input circuit gain. A clipping condition must not occur for a certain time period (release time) before a microprocessor increases the gain of the input circuit gain.

A comparator amplifier 426 compares the positive output signal received from the RC circuit 412 to a scaled supply signal derived from a positive voltage supply. A voltage divider 420 determines the scaled voltage signal. An example voltage divider 420 includes a 10.5 kilo ohm resistor 422 and a 3.24 kilo resistor 424. The scaled voltage can found by the following equation:

$$\text{scaled voltage} = \text{positive supply voltage} * [\text{resistor 424}/(\text{resistor 422} + \text{resistor 424})] = \text{positive supply voltage} * 0.236 \quad (14)$$

The comparator amplifier 426 generates a logic "one" comparator signal if the scaled supply signal exceeds the positive output signal received from the RC circuit 412. The comparator amplifier 426 generates a logic "zero" comparator signal if the scaled supply signal is less than the positive output signal received from the RC circuit 412. The comparator amplifier 426 sends the comparator signal through an input base resistor 428 to the base input of a transistor 430. A logic "one" comparator signal causes a non-conducting state for the transistor resulting in a logic "zero" clip signal being sent to a microprocessor. A logic "zero" comparator signal causes a conducting state for the transistor resulting in a logic "one" clip signal being sent to a microprocessor. The clip detection circuit 400 sends a clip signal to a microprocessor (not shown), which can then adjust the gain of the input gain circuit (not shown) in response to the clip signal and a met attack/release time. The clip detection circuit 400 generates a logic "one" clip signal if the scaled supply signal is less than the positive output signal received from the RC circuit 412. The clip detection circuit 400 generates a logic "zero" clip signal if the scaled supply signal is less than the positive output signal received from the RC circuit 412.

The microprocessor reduces the input gain of an input gain circuit in response to a logic "one" clip signal that has met the attack time of 1.5 mS. A logic "one" clip signal occurring for less than 1.5 mS is ignored by the microprocessor. A short lived voltage signal spike can create the short lived clip signal. The microprocessor waits for the logic "one" clip signal to occur for longer than the attack time to ensure that the input gain really needs to be reduced. Altering the resistor 414 and capacitor 416 values changes the attack time.

The microprocessor increases the input gain of an input gain circuit in response to a logic "zero" clip signal that has met the release time of 47 mS. A logic "zero" clip signal occurring for less than 47 mS is ignored by the microprocessor. The microprocessor waits for the logic "zero" clip signal to occur for longer than the release time to ensure that the input gain can safely increase. Altering the resistor 418 and capacitor 416 values changes the release time.

Figure 5:
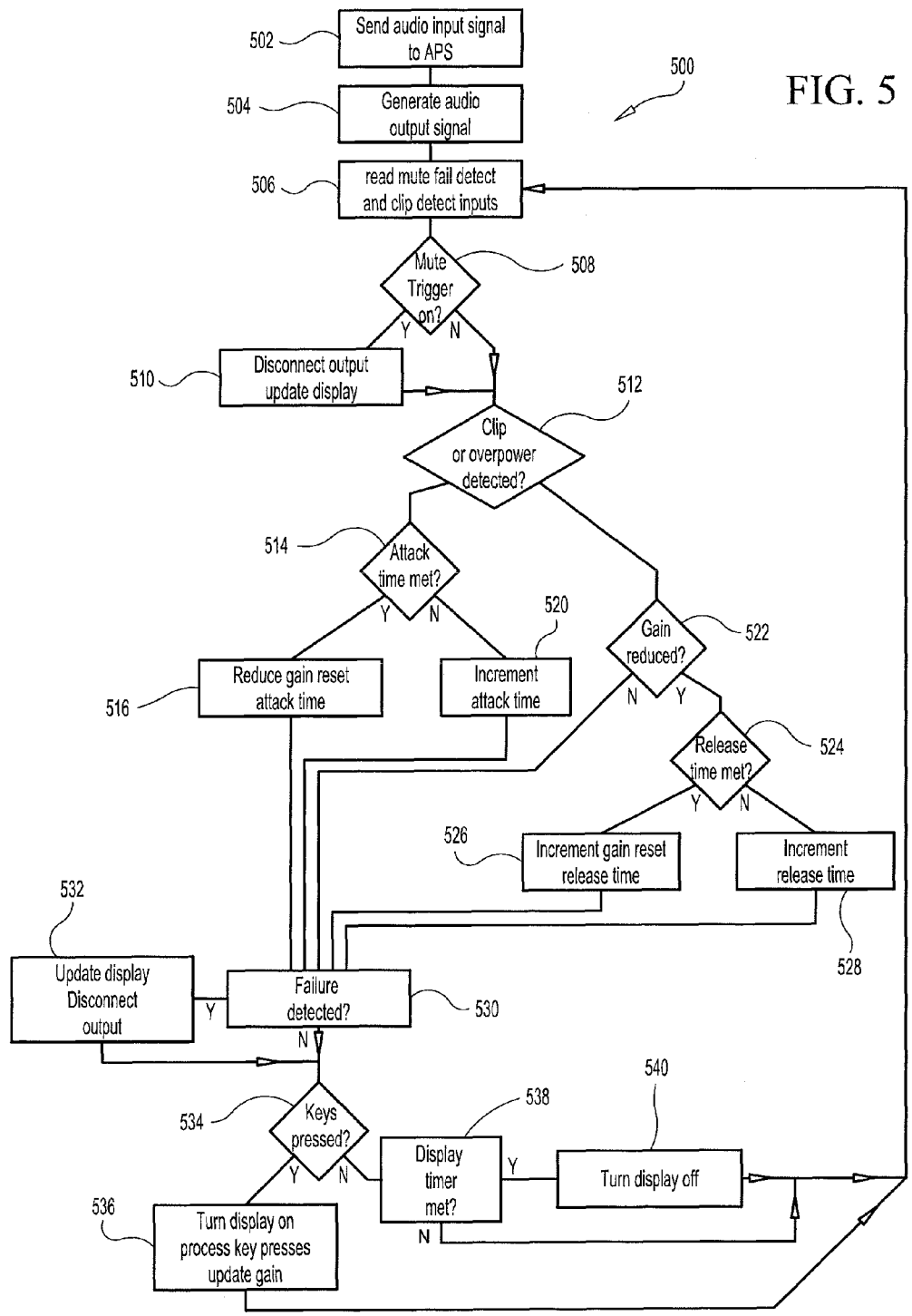
FIG. 5 is a flow diagram showing an approach for operating an audio processing system, according to another example embodiment of the present invention.

FIG. 5 illustrates a flow chart for operating an audio processing system, according to another example embodiment of the present invention. Audio processing systems that can be used in connection with the approach shown in and discussed herein with the flow chart 500 may include, for example, similar components to that shown with the audio processing system 200 in FIG. 2. An input source enabled by a user sends an audio input signal to an audio processing system (APS) at block 502. At least one audio output signal is generated in response to the audio input signal at block 504. A microprocessor, microcontroller (or other processing arrangement) reads any received mute input signals (for significantly reducing volume), clip input signals (indicating clip conditions), over power signals (indicating that an allowable amount of power is exceeded) and failure signals (e.g., overheating, power failure, short circuit, improper supply voltage) at block 506.

If a mute signal is on at block 508, the audio output signal is disconnected from at least one output load at block 510. For example, a muted audio output signal (channel) can be physically removed from an output load with a relay component. Alternately, where the mute condition is desirably used to reduce, but not disconnect the audio output signal, the audio output signal is reduced at block 510. In addition, a display indicating a mute condition is also optionally updated at block 510.

If an overpower and/or clip condition is detected at block 512 (e.g., if a microprocessor reads a logic "one" overpower signal and/or a clip indication signal), then the attack time is checked. The attack time is determined by RC circuit components for both an overpower detection circuit and a clip detection circuit and is usefully, for example, to reduce or eliminate gain level responses to very short overpower and/or clip conditions. If the attack time is not met at block 514, the attack time is incremented at block 520 to a new attack time (e.g., an attack time counter is incremented). If the clip and/or overpower condition persists, the attack time is again checked at block 514, with the new attack time being used. The steps of checking and incrementing the attack time are repeated while overpower and/or clip conditions persist. If the overpower and/or clip conditions cease to persist before the attack time has been met, the attack time counter is optionally reset after a predefined time (e.g., when the overpower and/or clip conditions have stopped for a sufficient time period). If the attack time is met at block 514, the input gain for the audio input signal is reduced and the attack time is reset at block 516.

If an overpower or clip condition is not detected at block 512 (e.g., if a microprocessor reads a logic "zero" overpower and/or clip indication signal indicating no overpower and/or clip condition), the gain is checked for having been reduced in response to an overpower and/or clip condition. If the gain has not been reduced at block 522 (e.g., indicating that normal operating conditions are occurring), the process proceeds to block 530, discussed further below. If the gain has been reduced at block 522, a release time is checked at block 524. The release time is determined by RC circuit components for both an overpower detection circuit and a clip detection circuit in a manner similar to the attack time determination discussed above. If the release time is not met at block 524, the release time is incremented at block 528. The steps of checking and incrementing the release time are repeated while the overpower and/or clip conditions do not exist and the gain is reduced. If the release time is met at block 524, the input gain for the audio input signal is incremented and the release time is reset at block 526.

At block 530, one or more failure conditions are checked including, for example, amplifier power failure conditions, overheating conditions, short circuit conditions and improper power supply voltage conditions. If a failure condition is detected at block 530, output disconnect signal(s) are sent to an output disconnect block (e.g., similar to the output disconnect block 214 in FIG. 2) and an output load is disconnected from a failing power amplifier at block 532. Optionally, failing status condition(s) are also sent to a status display at block 532.

A variety of other user interface options are also implemented in connection with this example embodiment. In one implementation, signals input via a keypad at block 534 are processed. These user input signals may include, for example, signals for selecting an audio channel, adjusting volume controls for a selected channel, locking/unlocking the volume controls and a second multi-key press combination to enable/disable a clip detection circuit. If key(s) are pressed at block 534, a display screen is turned on at block 536, the key presses are processed and/or volume controls are updated. If a user does not press any key at block 534, a display timer is checked at block 538 and, if met, the display is turned off at block 540. For example, a display timer having a display time equal to five seconds turns the display screen "OFF" at block 540 once the display time of five seconds has been met without any key presses. The display screen remains "ON" as long as the display timer has not been met. Optionally, other user input devices are used in addition to and/or instead of a keypad, with inputs being accordingly detected at block 534.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. An audio processing system comprising:
a digital input gain circuit having at least one input gain block, each input gain block for generating an output signal in response to an audio input signal and a digital gain control signal; a power amplifier circuit, coupled to an output load, having at least one power amplifier, each power amplifier for generating an audio output signal in response to the output signal;
an overpower detection circuit for generating at least one overpower detection signal in response to the audio output signal from the at least one power amplifier and varying output load and line conditions associated with the power amplifier circuit; and
a microprocessor and a keypad coupled to the microprocessor for selecting an audio output signal and entering input gain levels for a selected audio output signal, the microprocessor programmed for generating the digital gain control signal in response to the input gain levels and for reducing the digital gain control signal according to a gain factor that determines a rate of gain reduction in response to the at least one overpower detection signal indicating an overpower condition, and for setting a limit for the digital gain control signal in response to the at least one overpower detection signal indicating absence of an overpower condition.

2. The audio processing system of claim 1, wherein the system further includes a clip detection circuit for generating a clip detection signal in response to the audio output signal, the microprocessor further for generating digital gain control signals in response to the clip detection signal and the input gain levels and for, in response to the at least one overpower detection signal indicating absence of an overpower condition for a predetermined release time, incrementally increasing the digital gain control signal until the at least one overpower detection signal indicates an overpower condition or the digital gain control signal is no longer reduced in response to an overpower condition.

3. The audio processing system of claim 1, wherein the system further includes a switching means for coupling an input source to at least one audio output signal.

4. The audio processing system of claim 1, wherein the system further includes an output disconnect block for removing each power amplifier from being coupled with its output load.

5. The audio processing system of claim 1, wherein the system further includes a display screen for indicating an active audio output signal, a clip detection signal, a mute audio output signal, a gain level, and fault status information for all audio output signals.

6. The audio processing system of claim 1, further including a clip detection circuit for generating a clip detection signal in response to each audio output signal, and wherein the microprocessor is further for generating digital gain control signals in response to the clip detection signal and the input gain levels; and wherein each power amplifier has a built-in fault detection circuit for monitoring at least one of: power failure; overheating; short circuit; and improper rail voltage.

7. The audio processing system of claim 2, wherein the keypad and the microprocessor are adapted to allow a user to lock gain levels, unlock gain levels, enable the clip detection circuit, and disable the clip detection circuit.

8. The audio processing system of claim 1, wherein the digital input gain circuit operates as a digital potentiometer having programmable gain settings.

9. The audio processing system of claim 8, wherein the digital input gain circuit operating as a digital potentiometer has preset variable gain settings dependent on preset variable resistance settings.

10. The audio processing system of claim 1, wherein the microprocessor is further for generating digital gain control signals in response to input gain levels and for muting signals received from a keypad, at least one clip detection signal, and at least one overpower detection signal.

11. The audio processing system of claim 1, wherein the microprocessor selects an audio channel, sets a gain level for the channel, enables a clip detection circuit for the channel, disables a clip detection circuit for the channel and locks out further adjustments to the gain level of the channel.

12. The audio processing system of claim 1, wherein the microprocessor removes each power amplifier from its output load when a fault detection signal is present by engaging its output disconnect relay and sends fault detection signals to a display screen if a fault condition is received from a fault detection circuit of a power amplifier.

13. The audio processing system of claim 2, wherein the clip detection circuit is further for an analog detection by integrating a clip signal, thereby ignoring amplifier clipping events lasting less than a predetermined attack time, while responding to amplifier clipping events lasting longer than the predetermined attack time.

14. The audio processing system of claim 2, wherein the clip detection circuit is further for an analog detection by integrating a non-clip signal; thus ignoring amplifier non-clipping events lasting less than a predetermined release time, while responding to amplifier non-clipping events lasting longer than the predetermined attack time.

15. The audio processing system of claim 2, wherein the clip detection circuit is further for an analog detection that looks at the full audio spectrum for a potential clip signal, and not just in the low frequency band.

16. The audio processing system of claim 2, wherein the clip detection circuit is further for deriving its clip threshold level from a scaled positive audio amplifier voltage rail thereby facilitating automatic tracking of fluctuations in rail voltages due to varying load and varying line conditions.

17. The audio processing system of claim 1, wherein the microprocessor is further for sending digital gain control signals, having digitally set time constants, to the digital input gain circuit.

18. The audio processing system of claim 1, wherein the system further includes a clip detection circuit for generating a clip detection signal in response to each audio output signal, the microprocessor programmed for generating digital gain control signals in response to at least one of: a clip detection signal, an overpower detection signal and the input gain levels, the microprocessor further being programmed to:
  in response to at least one of an overpower or clip condition indicated by an overpower or clip signal, enter an attack mode in which, after a preset attack time, the digital gain control signal is rapidly reduced to a reduced level; and
  in response to the at least one of an overpower or clip condition ceasing to be indicated by an overpower or clip signal after the digital gain control signal has been reduced, enter a release mode in which the digital gain control signal is maintained at the reduced level for a set release time and, at the end of the set release time, in which the digital gain control is returned to the input gain levels.

19. The audio processing system of claim 18, wherein the microprocessor is programmed to:
  in response to the at least one of an overpower or clip condition existing and the preset attack time not being met, increment an attack time counter;
  in response to the overpower or clip condition persisting, repeat the step of incrementing the attack time counter until the attack time has been met and, when the attack time has been met, reduce the digital gain control signal and reset the attack time;
  in response to the at least one of an overpower or clip condition ceasing to be indicated by an overpower or clip signal and the release time not being met, incrementing a release time counter; and
  in response to the overpower or clip condition continuing to cease to be indicated after the digital gain control signal has been reduced, repeat the step of incrementing the release time counter until the release time has been met and, when the release time has been met, returning the digital gain control to the input gain levels.

20. An audio processing system comprising:
  a digital input gain circuit having a plurality of input gain blocks, wherein each of the input gain blocks generates an output signal in response to an audio input signal and a digital gain control signal;
  a power amplifier circuit, coupled to an output load, having a plurality of power amplifiers, wherein each of the power amplifiers generates an audio output signal in response to one of the output signals generated by the input gain blocks;
  an overpower detection circuit for generating respective overpower detection signals in response the audio output signals generated by the power amplifiers and varying output load and line conditions associated with the power amplifier circuit;

a microprocessor and a keypad coupled to the microprocessor for selecting one of the audio output signals and entering input gain levels for the selected audio output signal; and the microprocessor for generating the digital gain control signals in response to the input gain levels and for reducing the digital gain control signal according to a gain factor that determines a rate of gain reduction in response to the at least one overpower detection signals indicating an overpower condition, and for setting a limit for the digital gain control signal in response to the at least one overpower detection signal indicating absence of an overpower condition.

21. The audio processing system of claim 20, further comprising a clip detection circuit for generating respective clip detection signals in response to each of the audio output signals generated by the power amplifiers, the microprocessor being adapted for generating the digital gain control signals further in response to at least one of the clip detection signals.

* * * * *